(12) United States Patent
Bandholz et al.

(10) Patent No.: US 8,107,254 B2
(45) Date of Patent: Jan. 31, 2012

(54) INTEGRATING CAPACITORS INTO VIAS OF PRINTED CIRCUIT BOARDS

(75) Inventors: Justin P. Bandholz, Cary, NC (US); Jonathan R. Hinkle, Raleigh, NC (US); Pravin Patel, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 12/274,407

(22) Filed: Nov. 20, 2008

(65) Prior Publication Data

US 2010/0124035 A1 May 20, 2010

(51) Int. Cl.
*H05K 3/00* (2006.01)
(52) U.S. Cl. ........ 361/763; 174/266; 174/261; 174/264; 361/761
(58) Field of Classification Search .................. 174/266, 174/261, 264; 361/761, 763, 782
See application file for complete search history.

(56) References Cited

U.S. PATENT DOCUMENTS

| | | | |
|---|---|---|---|
| 4,733,461 A | 3/1988 | Nakano | |
| 5,452,178 A | 9/1995 | Emesh et al. | |
| 5,963,464 A | 10/1999 | Dell et al. | |
| 5,967,799 A | 10/1999 | Arai | |
| 5,998,259 A | 12/1999 | Chuang | |
| 6,194,774 B1 | 2/2001 | Cheon | |
| 6,197,181 B1 | 3/2001 | Chen | |
| 6,290,833 B1 | 9/2001 | Chen | |
| 6,300,578 B1 | 10/2001 | Hoffmeyer et al. | |
| 6,404,001 B2 | 6/2002 | Koo et al. | |
| 6,512,285 B1 | 6/2003 | Hashemi et al. | |
| 6,621,012 B2 | 9/2003 | Crockett et al. | |
| 6,638,410 B2 | 10/2003 | Chen et al. | |
| 6,646,520 B2 | 11/2003 | Miller | |
| 6,678,145 B2 | 1/2004 | Naito et al. | |
| 6,680,659 B2 | 1/2004 | Miller | |
| 6,717,071 B2 * | 4/2004 | Chang et al. | 174/266 |
| 6,775,901 B1 | 8/2004 | Lee et al. | |
| 6,803,665 B1 | 10/2004 | Megahed et al. | |
| 6,822,529 B2 | 11/2004 | Miller | |

(Continued)

FOREIGN PATENT DOCUMENTS

EP 0 213 205 A1 11/1987

(Continued)

OTHER PUBLICATIONS

Annonymous; Method for A Cylindrical Chip Capacitor; IP.com Prior Art Database Technical Disclosure; Mar. 16, 2005; IP.com.

(Continued)

*Primary Examiner* — Tuan T Dinh
*Assistant Examiner* — Hung Dang
(74) *Attorney, Agent, or Firm* — Brandon C. Kennedy; Cynthia G. Seal; Biggers & Ohanian, LLP

(57) ABSTRACT

A printed circuit board ('PCB') with a capacitor integrated within a via of the PCB, the PCB including layers of laminate; a via that includes a via hole traversing layers of the PCB, the via hole characterized by a generally tubular inner surface; a capacitor integrated within the via, the capacitor including two capacitor plates, an inner plate and an outer plate, the two plates composed of electrically conductive material disposed upon the inner surface of the via hole, both plates traversing layers of the laminate, the inner plate traversing more layers of the laminate than are traversed by the outer plate; and a layer of dielectric material disposed between the two plates.

10 Claims, 5 Drawing Sheets

U.S. PATENT DOCUMENTS

| | | |
|---|---|---|
| 6,853,003 B2 | 2/2005 | Lee |
| 6,913,471 B2 | 7/2005 | Smith |
| 6,927,481 B2 | 8/2005 | Gibson et al. |
| 6,958,547 B2 | 10/2005 | Dubin et al. |
| 6,983,535 B2 | 1/2006 | Crockett et al. |
| 7,005,721 B2 | 2/2006 | Nishijima |
| 7,118,985 B2 | 10/2006 | Allman et al. |
| 7,186,919 B2 | 3/2007 | Kim et al. |
| 7,204,648 B2 | 4/2007 | Aronson |
| 7,227,240 B2 | 6/2007 | Knapp et al. |
| 7,277,005 B2 | 10/2007 | Kang et al. |
| 7,342,300 B2 | 3/2008 | Wight et al. |
| 2002/0191366 A1 | 12/2002 | Naito et al. |
| 2005/0062556 A1 | 3/2005 | Aronson |
| 2005/0178669 A1 | 8/2005 | Strubbe |
| 2005/0184825 A1 | 8/2005 | Oran |
| 2005/0233501 A1 | 10/2005 | Nose et al. |
| 2007/0103251 A1 | 5/2007 | Fan et al. |
| 2007/0117348 A1 | 5/2007 | Ramanathan et al. |
| 2008/0054428 A1 | 3/2008 | Lam |

FOREIGN PATENT DOCUMENTS

| | | |
|---|---|---|
| EP | 1 202 296 A1 | 2/2002 |
| JP | 6140451 A | 5/1994 |
| JP | 2000031651 A | 1/2000 |
| JP | 2008028188 | 2/2008 |
| KR | 20030084355 | 11/2003 |
| WO | PCT/JP85/00704 | 11/1987 |
| WO | WO 2004/025695 A2 | 3/2004 |

OTHER PUBLICATIONS

Office Action U.S. Appl. No. 12/274,407, filed May 24, 2011.

* cited by examiner

US 8,107,254 B2

INTEGRATING CAPACITORS INTO VIAS OF PRINTED CIRCUIT BOARDS

BACKGROUND OF THE INVENTION

1. Field of the Invention

The field of the invention is methods and apparatus for integration of capacitors into vias of printed circuit boards.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas that has seen considerable development is PCB design, particularly as PCB bandwidths have advanced well into the gigahertz region. As electronic bandwidths expand, the impedances inherent in the conductive pathways on the PCBs themselves become relevant. PCB designs use capacitors formed in packages that have various parasitic inductance values based on their geometries and the technology utilized. Many various capacitor designs have been introduced to try to reduce the capacitor's lead lengths and structure to reduce inductance such as low inductance capacitor arrays ('LICAs'), inter-digitated capacitors ('IDTs'), reverse geometry capacitors, and other designs also. The interest in improved capacitor design on PCBs persists because parasitic capacitor inductance reduces electrical coupling and decoupling effectiveness as switching frequencies of signals increase.

SUMMARY OF THE INVENTION

A printed circuit board ('PCB') with a capacitor integrated within a via of the PCB, the PCB including layers of laminate; a via that includes a via hole traversing layers of the PCB, the via hole characterized by a generally tubular inner surface; a capacitor integrated within the via, the capacitor including two capacitor plates, an inner plate and an outer plate, the two plates composed of electrically conductive material disposed upon the inner surface of the via hole, both plates traversing layers of the laminate, the inner plate traversing more layers of the laminate than are traversed by the outer plate; and a layer of dielectric material disposed between the two plates.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Examples of a printed circuit board ('PCB') with a capacitor integrated within a via of the PCB and methods of manufacturing such a PCB according to embodiments of the present invention are described with reference to the accompanying drawings, beginning with FIGS. 1A-1C. A capacitor is an electrical component that can store energy in an electric field between a pair of conductors, each of which is called a 'plate.' The process of storing energy in the capacitor is known as "charging", and involves electric charges of equal magnitude, but opposite polarity, building up on each plate. A capacitor's ability to store charge is its capacitance, measured in units of farads. Capacitors are often used in electronic circuits to differentiate between high-frequency and low-frequency signals, exclude direct current from a portion of a circuit, bypass alternating current to ground, and so on. In modern electronic systems, electronic components are typically connected together for communication using a PCB. A PCB is a flat panel that interconnects electronic components using a pattern of flat conductors, often referred to as 'traces,' laminated onto a non-conductive substrate. A printed circuit board may contain trace patterns on the top and bottom surfaces of the printed circuit board or in layers through the middle of the printed circuit board. Traces on different layers of a printed circuit board interconnect through 'vias.' A via is a conductor that plates the wall of a hole extending through the layers of a PCB. In this specification, the term 'via' is used to refer to the entire assembly of the wall through the layers of a PCB as well as the walls that define the hole and any conductive material disposed within the hole of the via.

Figure 1A:
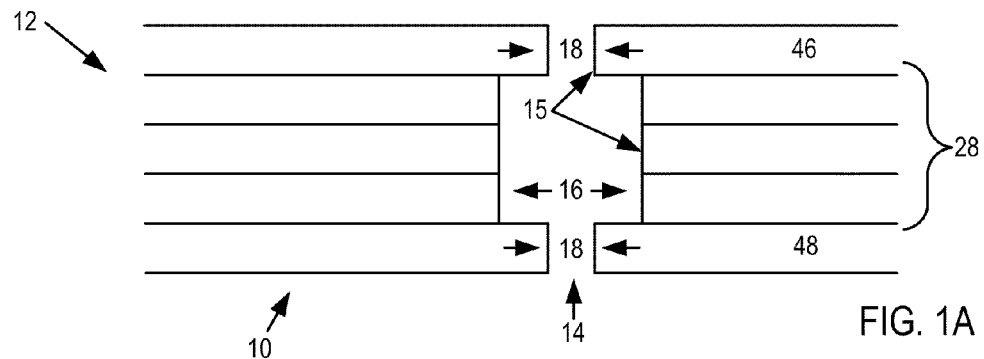
FIG. 1A sets forth a cross-sectional plan view of an example PCB that includes a via hole in which a capacitor may be integrated according to embodiments of the present invention.

FIG. 1A sets forth a cross-sectional plan view of an example PCB (10) that includes a via hole (14) in which a capacitor may be integrated according to embodiments of the present invention. The PCB in the example of FIG. 1A is composed of five layers (12) of laminate, non-conductive substrate material. The via hole (14), which is characterized by a generally tubular inner surface (15), traverses all five layers of laminate in two diameters, one diameter (18) through the outer two layers (46, 48) of laminate and another, larger diameter (16) through the center three layers (28) of laminate.

Figure 1B:
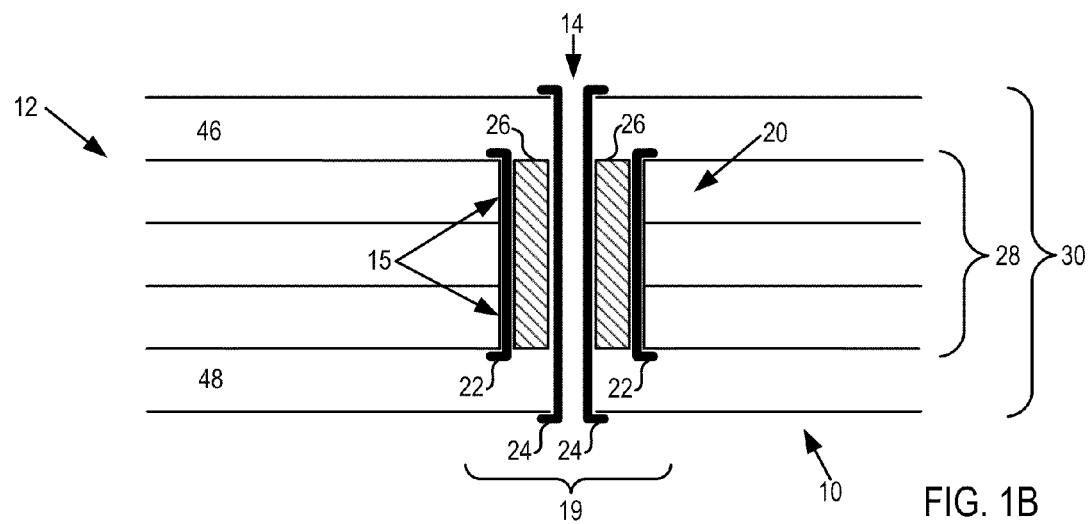
FIGS. 1B-1D set forth cross-sectional plan views of example PCBs with a capacitor integrated in a via according to embodiments of the present invention.

For further explanation, FIG. 1B sets forth a cross-sectional plan view of an example PCB (10) that includes a via hole (14) in which a capacitor is integrated according to embodiments of the present invention. The PCB in the example of FIG. 1B is composed of layers of laminate (20), and the PCB includes a via (19) that in turn is composed of a via hole (14) traversing layers of the PCB, with the via hole characterized by a generally tubular inner surface (15). A capacitor (20) is integrated within the via (19). The capacitor (20) includes two capacitor plates (22, 24), an inner plate (24) and an outer plate (22), the two plates composed of electrically conductive material disposed upon the inner surface (15) of the via hole (14), both plates traversing layers of the laminate, the inner plate (24) traversing more layers (30) of the laminate than are traversed (28) by the outer plate (22).

The capacitor (20) also includes a layer of dielectric material (26) disposed between the two plates (22, 24). The dielectric material (26) is a nonconducting substance, that is, an insulator, having a permittivity with respect to an electric field. The permittivity of the dielectric may be selected, along with the physical dimensions of the capacitor, as an aid to setting the capacitor to some particular level of capacitance. As a efficiency in manufacture, for an alternative example, the dielectric material may be epoxy filling the via hole when the outer layers (46, 48) of laminate are added to the PCB during manufacture.

Figure 1C:
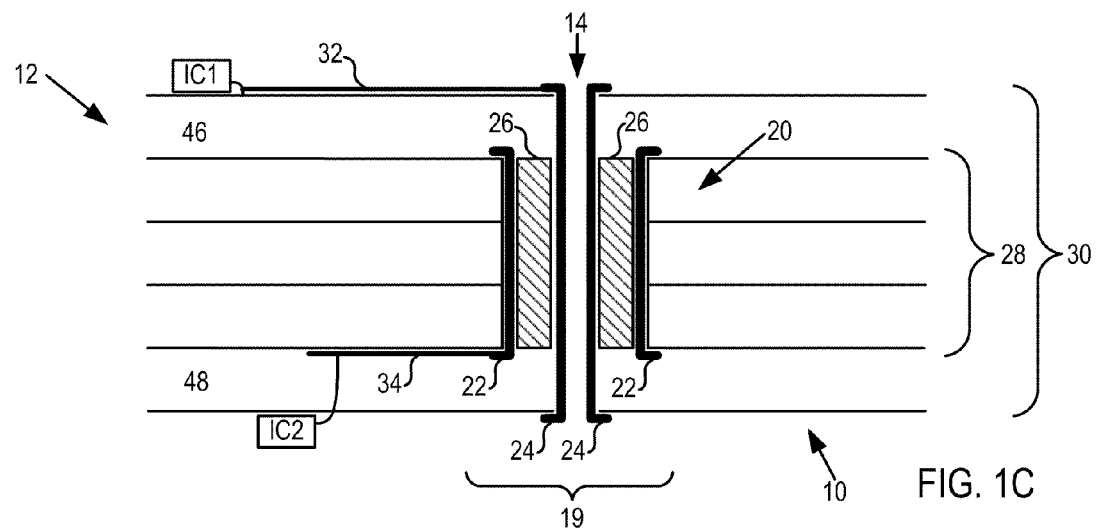

For further explanation, FIG. 1C sets forth a cross-sectional plan view of a further example PCB (10) that includes a via hole (14) in which a capacitor is integrated according to embodiments of the present invention. Like the example of FIG. 1B, the PCB in the example of FIG. 1C is composed of layers of laminate (20), and the PCB includes a via (19) composed of a via hole (14) traversing layers of the PCB, with a capacitor (20) integrated within the via (19). The capacitor (20) is made up of includes two capacitor plates (22, 24) and a layer of dielectric material (26) disposed between the two plates. In this example, a first signal conductor (32) is formed upon a layer (46) of the PCB and a second signal conductor (34) is formed upon another layer (48) of the PCB, and the two signal conductors are connected through the capacitor (20) so as to pass alternating current from the first signal conductor (32) to the second signal conductor (34) while blocking direct current. The signal conductors (32, 34) are electrically conductive pathways formed upon two or more layers (46, 48) of the PCB so as to couple the two plates (22, 24) of the capacitor (20) to other components of the PCB. Such conductive pathways are typically formed of copper as signal 'traces,' 'pads,' or 'lands' coupling electronic components installed on a PCB. In this example, the other components so coupled for conductance of alternating current signals are two integrated circuit packages (IC1, IC2). The use of integrated circuits in this example if for ease of explanation, not a limitation of the invention, because such coupling of integrated circuit packages will be a frequent use of capacitors integrated in vias. Readers will recognize, however, that capacitors integrated in vias according to embodiments of the present invention can be used to AC couple any of a variety of electronic components including resistors, other capacitors, inductors, transistors, and so on. Electronic components such as integrated circuits (IC1, IC2) may be connected to the PCB using, for example, surface mounting technology, through-hole mounting technology, or any other technology as will occur to those of skill in the art. Surface mount technology connects electronic components to the PCB by soldering electronic component leads or terminals to the top surface of the printed circuit board. Through-hole mount technology connects electronic components to the PCB by inserting component leads through holes in the printed circuit board and then soldering the leads in place on the opposite side of the printed circuit board.

Figure 1D:
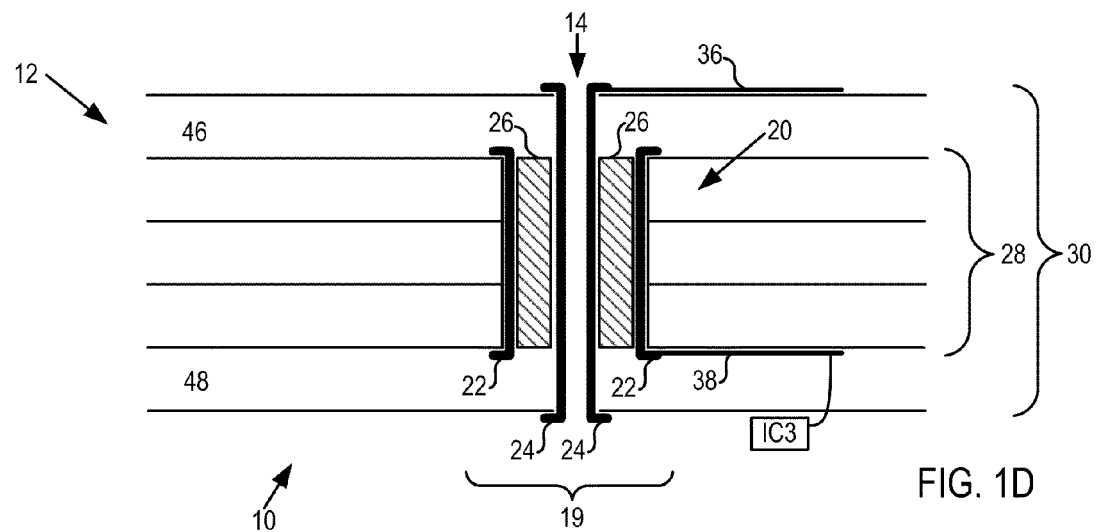

For further explanation, FIG. 1D sets forth a cross-sectional plan view of a further example PCB (10) that includes a via hole (14) in which a capacitor is integrated according to embodiments of the present invention. Like the examples of FIGS. 1B and 1C, the PCB in the example of FIG. 1D is composed of layers of laminate (20), and the PCB includes a via (19) composed of a via hole (14) traversing layers of the PCB, with a capacitor (20) integrated within the via (19). The capacitor (20) is made up of includes two capacitor plates (22, 24) and a layer of dielectric material (26) disposed between the two plates. The PCB (10) of FIG. 1C also includes a ground plane (38) formed upon a layer (48) of the PCB and a power plane (36) formed upon another layer of the PCB. The ground plane (38) and the power plane (36) are connected through the capacitor (20) so as to bypass alternating current from the power plane to the ground plane. The ground plane (38) is a layer of conductive material, typically copper, formed on a surface of a laminate layer (38) of the PCB (10) so as to appear to most signals as a ground potential. The ground plane reduces noise generally among components of the PCB and provides a reference potential against which electronic components mounted on the PCB can compare different signal voltages. The ground plane (38) also eases circuit design, allowing a designer to ground signals without having to run multiple signal conductors around or through a PCB; a component that needs grounding on one layer (e.g., IC3) can be routed directly to a ground plane on another layer. The power plane (36), also a layer of copper on a laminate layer (46) of the PCB, is a counterpart to the ground plane that is configured to provide an AC signal ground (through capacitor 20) while also providing DC voltage for powering components mounted on the PCB.

Figure 2A:
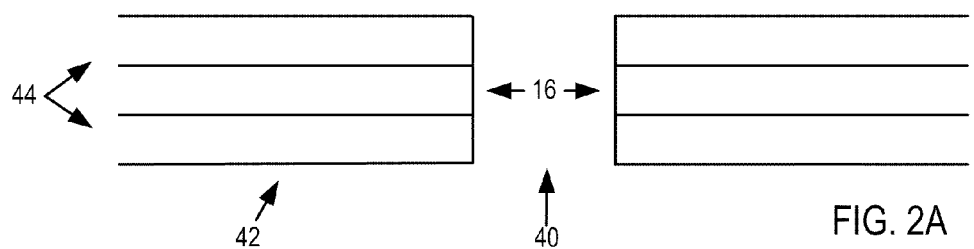
FIGS. 2A-2E set forth cross-sectional plan views of various steps in methods of manufacturing a PCB with a via hole in which a capacitor is integrated according to embodiments of the present invention.

For further explanation, FIGS. 2A-2E set forth cross-sectional plan views of example PCBs (10) illustrating methods of integrating a capacitor within a via hole according to embodiments of the present invention. The example of FIG. 2A illustrates a first layered section (42) of a PCB, where the first layered section is composed of three layers of laminate (44) with a first via hole (40) drilled through the first layered section (42). The first via hole (40) is characterized by a tubular inner surface (16).

Figure 2B:
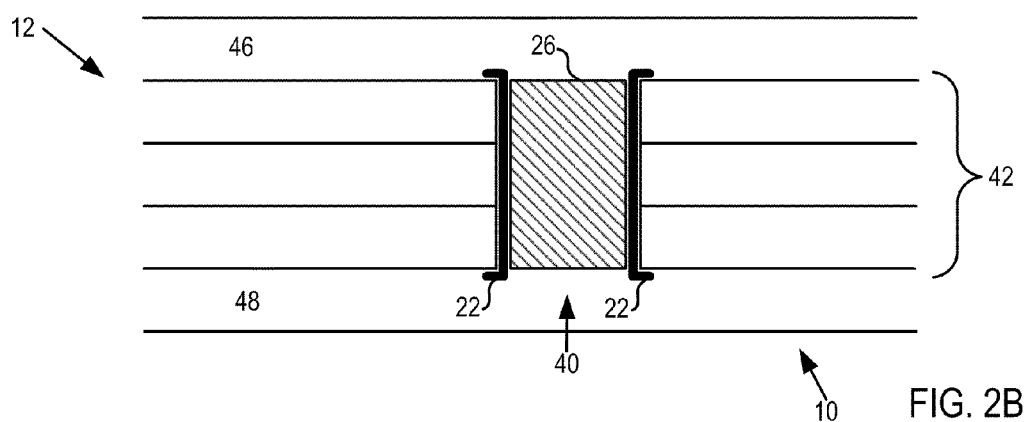
Figure 2C:
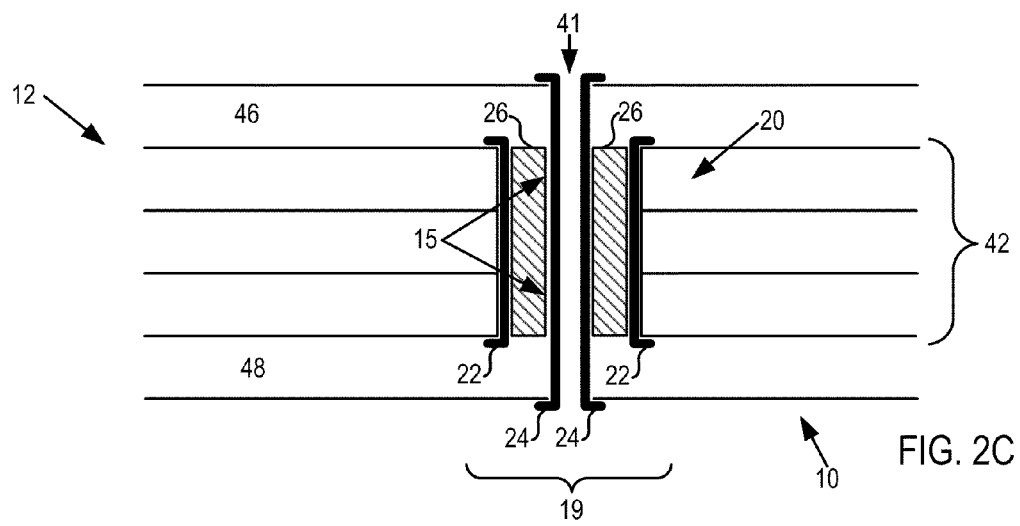

In the example of FIG. 2B, the tubular inner surface of the first via hole has been plated with a first layer (22) of conductive material, forming an outer plate of a capacitor. In addition, the first via hole has been filled with dielectric material (26). In the example of FIG. 2C, additional layered sections (46, 48) of the PCB have been laminated onto the first layered section (42), covering the filled first via hole (40).

In the example of FIG. 2C, a second via hole (41) is drilled through the center of the now filled and covered first via hole, with the second via hole (41) drilled through both the first layered section (42) and the additional layered sections (46, 48) of the PCB (10). The second via hole (41) now is characterized by the tubular inner surface of the dielectric material with the second via hole drilled through it. In addition, the tubular inner surface of the second via hole is plated with a second layer (24) of conductive material, forming an inner plate of a capacitor (20).

Figure 2D:
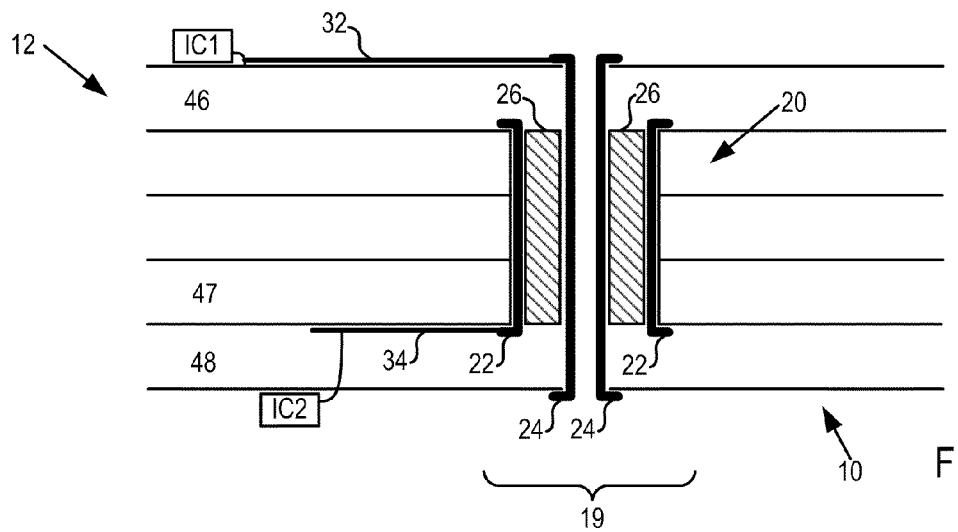

In the example of FIG. 2D, electrically conductive pathways (32, 34) are formed upon two or more layers (46, 47) of the PCB, and the electrically conductive pathways are connected to the plates (22, 24) of the capacitor (20) so that the electrically conductive pathways couple the two plates of the capacitor to other components of the PCB. In this example, the other components are represented by integrated circuits, IC1 and IC2. In the example of FIG. 2D, the electrically conductive pathways include a first signal conductor (32) formed upon a layer (46) of the PCB as well as a second signal conductor (34) formed upon another layer (47) of the PCB. The signal conductors (32, 34) are connected to the plates (22, 24) of the capacitor (20) so that the capacitor passes alternating current from the first signal conductor to the second signal conductor, and therefore from IC1 to IC2, while blocking direct current.

Figure 2E:
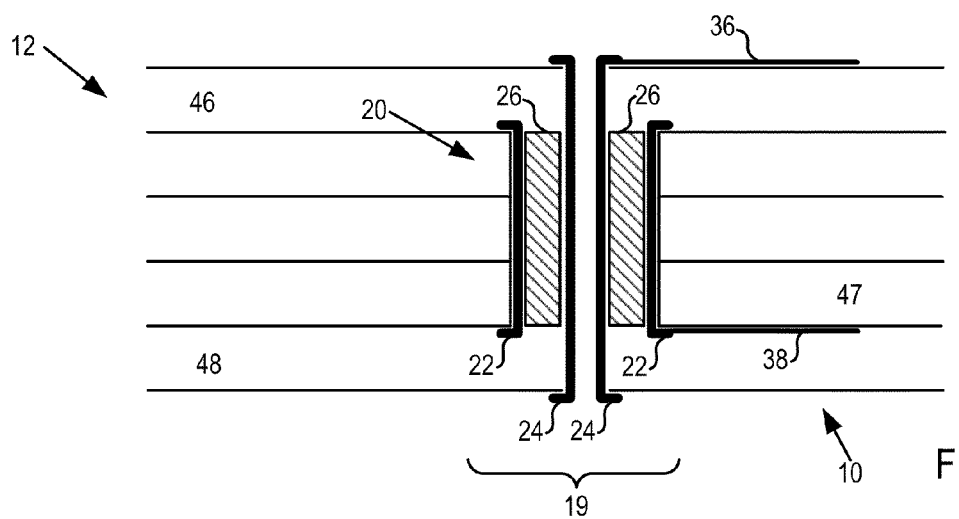

In the example of FIG. 2E, a ground plane (38) is formed upon a layer (46) of the PCB, and a power plane (36) is formed upon another layer of the PCB. The ground plane (38) and the power plane (36) are connected to the plates (22, 24) of the capacitor so that the capacitor (20) bypasses alternating current from the power plane to the ground plane.

Figure 3:
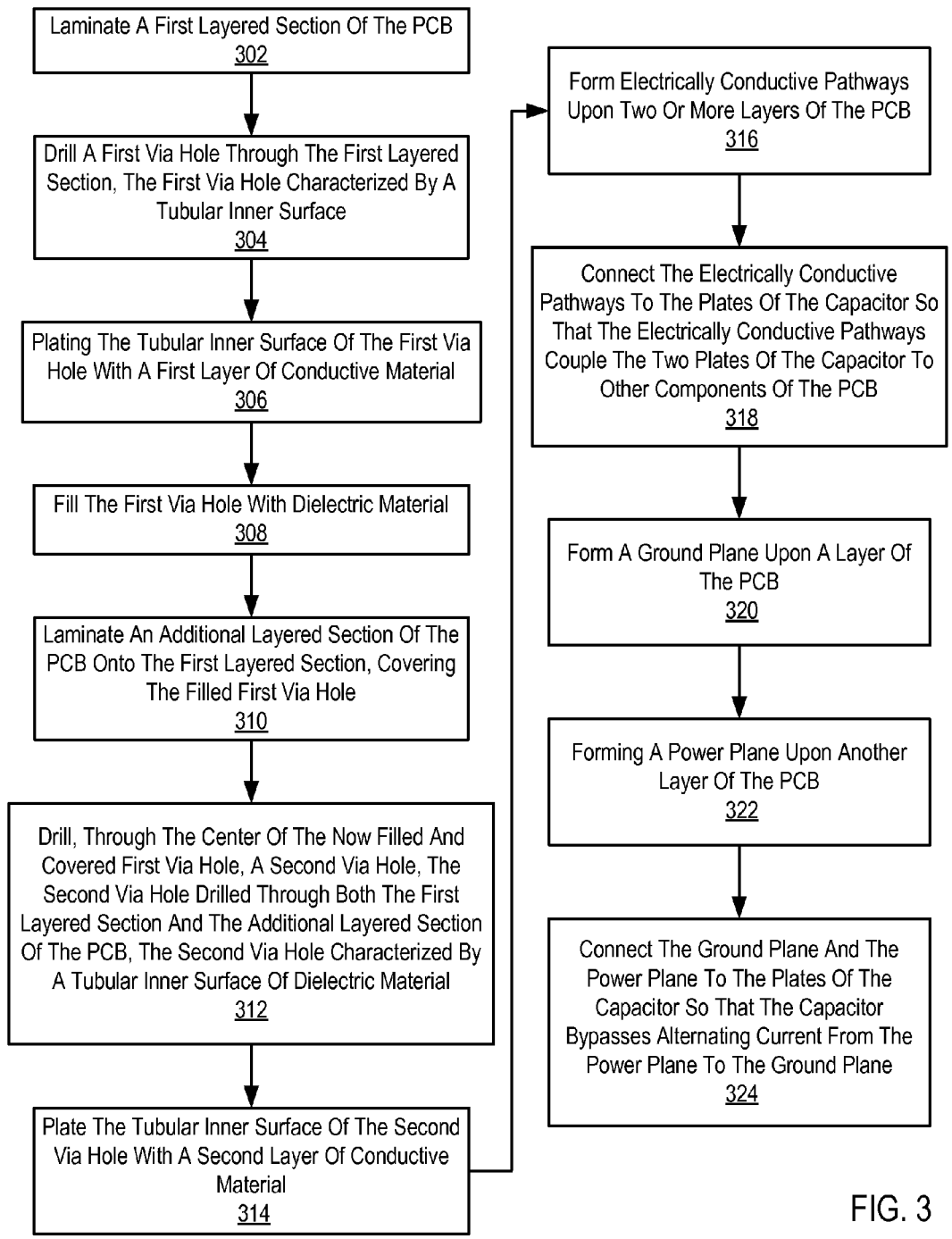
FIG. 3 sets forth a flow chart illustrating a method of manufacturing a PCB with a capacitor integrated within a via of the PCB.

For further explanation, FIG. 3 sets forth a flow chart illustrating a method of manufacturing a PCB with a capacitor integrated within a via of the PCB. The method of FIG. 3 is explained with reference both to FIG. 3 and also with reference to FIGS. 2A-2E. The PCB (10) is composed of laminated layers (44), and the method of FIG. 3 includes laminating (302) a first layered section (42) of the PCB (10). The method also includes drilling (304) a first via hole (40) through the first layered section (42), so that the first via hole is characterized by a tubular inner surface (16). The method of FIG. 3 also includes plating (306) the tubular inner surface (16) of the first via hole (40) with a first layer (22) of conductive material, thereby forming an outer capacitor plate. The method of FIG. 3 also includes filling (308) the first via hole with dielectric material (26). The method of FIG. 3 also includes laminating (310) an additional layered section (46, 48) of the PCB onto the first layered section (42), covering the filled first via hole. In the example of FIG. 2B it is seen that the additional layered section is composed of two additional layers of laminate (46, 48) layered onto the outside of the first layered section (42). The method of FIG. 3 also includes drilling (312), through the center of the now filled and covered first via hole (40), a second via hole (41), with the second via hole drilled through both the first layered section (42) and the additional layered section (46, 48) of the PCB, also with the second via hole characterized by a tubular inner surface (15) of dielectric material with the second via hole drilled through it. The method of FIG. 3 also includes plating (314) the tubular inner surface (15) of the second via hole (41) with a second layer (24) of conductive material, forming an inner capacitor plate within the via (19).

This example arrangement in FIG. 2C with two additional outside layers (46, 48) forming an additional layered section of the PCB (10) is presented for ease of explanation, not as a limitation of the present invention. In such an example, the via (19) formed by the first and second via holes is in fact a so-called 'through via,' because the via (19) traverses all the layers of the PCB. In fact, however, additional layered sections can be added to the first layered section (42) in various ways as will occur to those of skill in the art, forming, for example, 'microvias' or 'blind vias' which are visible only from one surface of the PCB, as well as 'buried vias' which are visible on neither surface of the PCB. Readers will recognize that all such vias can have capacitors integrated within them according to embodiments of the present invention.

The method of FIG. 3 also includes forming (316) electrically conductive pathways (32, 34 on FIG. 2D) upon two or more layers (46, 47) of the PCB (10) and connecting (318) the electrically conductive pathways to the plates (22, 24) of the capacitor (20) so that the electrically conductive pathways couple the two plates of the capacitor to other components (IC1, IC2) of the PCB. The method of FIG. 3 also includes forming (320) a ground plane (38 on FIG. 2E) upon a layer (48) of the PCB, forming (322) a power plane (36) upon another layer (46) of the PCB, and connecting (324) the ground plane and the power plane to the plates (22, 24) of the capacitor (20) so that the capacitor bypasses alternating current from the power plane to the ground plane.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A printed circuit board ('PCB') with a capacitor integrated within a via of the PCB, the PCB comprising:
   layers of laminate;
   a via comprising a via hole traversing layers of the PCB, the via hole characterized by a generally tubular inner surface;
   a capacitor integrated within the via, the capacitor comprising:
   two capacitor plates, an inner plate and an outer plate, the two plates composed of electrically conductive material disposed upon the inner surface of the via hole, both plates traversing layers of the laminate, the inner plate traversing more layers of the laminate than are traversed by the outer plate;
   a layer of dielectric material disposed between the two plates; and
   a ground plane formed upon a layer of the PCB and a power plane formed upon another layer of the PCB, the ground plane and the power plane connected through the capacitor so as to bypass alternating current from the power plane to the ground plane.

2. The PCB of claim 1 further comprising electrically conductive pathways formed upon two or more layers of the PCB, the electrically conductive pathways coupling the two plates of the capacitor to other components of the PCB.

3. The PCB of claim 1 further comprising a ground plane formed upon a layer of the PCB and a power plane formed upon another layer of the PCB, the ground plane and the power plane connected through the capacitor so as to bypass alternating current from the power plane to the ground plane.

4. A capacitor integrated within a via of a printed circuit board ('PCB'), the printed circuit board comprising layers of laminate, the PCB further comprising a via, the via comprising a via hole characterized by a generally tubular inner surface traversing layers of the PCB, the capacitor comprising:
   two capacitor plates, an inner plate and an outer plate, the two plates composed of electrically conductive material disposed upon the inner surface of the via hole, both plates traversing layers of the laminate, the inner plate traversing more layers of the laminate than are traversed by the outer plate; and
   a layer of dielectric material disposed between the two plates, wherein the capacitor is electrically coupled so as to bypass alternating current from a power plane formed upon a layer of the PCB to a ground plane formed upon another layer of the PCB.

5. The capacitor of claim 4 electrically coupled to components of the PCB through electrically conductive pathways formed upon two or more layers of the PCB.

6. A method of manufacturing a printed circuit board ('PCB') with a capacitor integrated within a via of the PCB, the PCB comprising a plurality of laminated layers, the method comprising:
   laminating a first layered section of the PCB;
   drilling a first via hole through the first layered section, the first via hole characterized by a tubular inner surface;
   plating the tubular inner surface of the first via hole with a first layer of conductive material;
   filling the first via hole with dielectric material;
   laminating an additional layered section of the PCB onto the first layered section, covering the filled first via hole;
   drilling, through the center of the now filled and covered first via hole, a second via hole, the second via hole drilled through both the first layered section and the additional layered section of the PCB, the second via hole characterized by a tubular inner surface of dielectric material;

plating the tubular inner surface of the second via hole with a second layer of conductive material;

forming a first signal conductor upon a layer of the PCB;

forming a second signal conductor upon another layer of the PCB; and connecting the signal conductors to the plates of the capacitor so that the capacitor passes alternating current from the first signal conductor to the second signal conductor while blocking direct current.

7. The method of claim 6 further comprising:

forming electrically conductive pathways upon two or more layers of the PCB; and connecting the electrically conductive pathways to the plates of the capacitor so that the electrically conductive pathways couple the two plates of the capacitor to other components of the PCB.

8. A method of manufacturing a capacitor integrated within a via of a printed circuit board (PCB), the PCB comprising a plurality of laminated layers, the method comprising:

laminating a first layered section of the PCB;

drilling a first via hole through a first layered section of the PCB, the first via hole characterized by a tubular inner surface;

forming an outer capacitor plate by plating the tubular inner surface of the first via hole with a first layer of conductive material;

filling the first via hole with dielectric material;

laminating an additional layered section of the PCB onto the first layered section, covering the filled first via hole;

drilling, through the center of the now filled and covered first via hole, a second via hole, the second via hole drilled through both the first layered section and the additional layered section of the PCB, the second via hole characterized by a tubular inner surface of dielectric material;

forming an inner capacitor plate by plating the tubular inner surface of the second via hole with a second layer of conductive material;

forming a first signal conductor upon a layer of the PCB;

forming a second signal conductor upon another layer of the PCB; and connecting the signal conductors to the plates of the capacitor so that the capacitor passes alternating current from the first signal conductor to the second signal conductor while blocking direct current.

9. The method of claim 8 further comprising:

forming electrically conductive pathways upon two or more layers of the PCB; and connecting the electrically conductive pathways to the plates of the capacitor so that the electrically conductive pathways couple the two plates of the capacitor to other components of the PCB.

10. A printed circuit board ('PCB') with a capacitor integrated within a via of the PCB, the PCB comprising:

layers of laminate;

a via comprising a via hole traversing layers of the PCB, the via hole characterized by a generally tubular inner surface;

a capacitor integrated within the via, the capacitor comprising:

two capacitor plates, an inner plate and an outer plate, the two plates composed of electrically conductive material disposed upon the inner surface of the via hole, both plates traversing layers of the laminate, the inner plate traversing more layers of the laminate than are traversed by the outer plate;

a layer of dielectric material disposed between the two plates; and a first signal conductor formed upon a layer of the PCB and a second signal conductor formed upon another layer of the PCB, the first signal conductor and the second signal conductor connected through the capacitor so as to pass alternating current from the first signal conductor to the second signal conductor while blocking direct current.

* * * * *